United States Patent [19]
Loo

[11] Patent Number: 5,394,009
[45] Date of Patent: Feb. 28, 1995

[54] TAB SEMICONDUCTOR PACKAGE WITH CUSHIONED LAND GRID ARRAY OUTER LEAD BUMPS

[75] Inventor: Mike C. Loo, San Jose, Calif.

[73] Assignee: Sun Microsystems, Inc., Mountain View, Calif.

[21] Appl. No.: 99,617

[22] Filed: Jul. 30, 1993

[51] Int. Cl.$^6$ .................... H01L 23/48; H01L 29/44; H01L 29/52; H01L 29/60
[52] U.S. Cl. .................... 257/666; 257/668; 257/692; 257/734; 257/737; 257/738; 257/778; 257/780
[58] Field of Search .............. 257/666, 668, 692, 697, 257/734, 735, 737, 738, 778, 779, 780, 781, 789; 361/723

[56] References Cited

U.S. PATENT DOCUMENTS 5,243,223  9/1993  Yamada et al. .................. 257/789

FOREIGN PATENT DOCUMENTS

0530758A2  3/1993  European Pat. Off. ............ 257/778
63-104435  5/1988  Japan ................................ 257/737

OTHER PUBLICATIONS

Lau, John H., et al. *Overview of Tape Automated Bonding Technology, Electronic Material Handbook,* vol. 1 Packaging, pp. 274–285.

Primary Examiner—Andrew J. James
Assistant Examiner—Carl Whitehead, Jr.
Attorney, Agent, or Firm—Blakely Sokoloff Taylor & Zafman

[57] ABSTRACT

A film of elastomeric material is used to laminate the tape with LGA outer lead bumps to the stiffner plate of the semiconductor package. The elastomeric material has the necessary physical and electrical characteristics to provide the required firmness to maintain good electrical contact between the outer lead bumps and the corresponding contacting pads on a socket, ceramic substrate or PWB, and at the same time, to provide the required resilience to accommodate differences in heights between the outer lead bumps. The stiffner plate is fabricated with a cavity at its center for accommodating the VLSI die, and slots along the outer edges of its underside for storing the excess elastomeric material squeezed out when laminating the tape to the stiffner plate, thereby preventing the excess squeezed out elastomeric material from building up at the outer edges of the semiconductor package to a height in excess of the outer lead bumps. As a result, the land pattern on the socket, ceramic substrate or PWB is not required to address the differences in heights between the outer lead bumps.

11 Claims, 2 Drawing Sheets

FIG _ 1
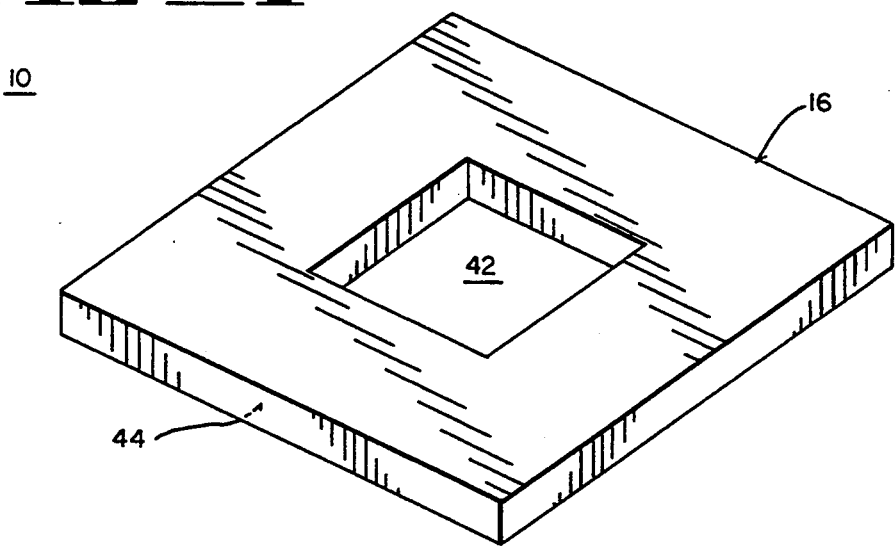
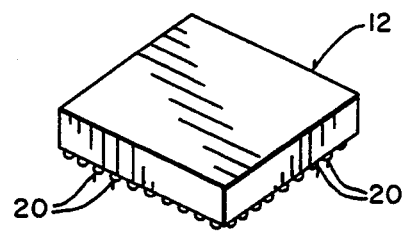
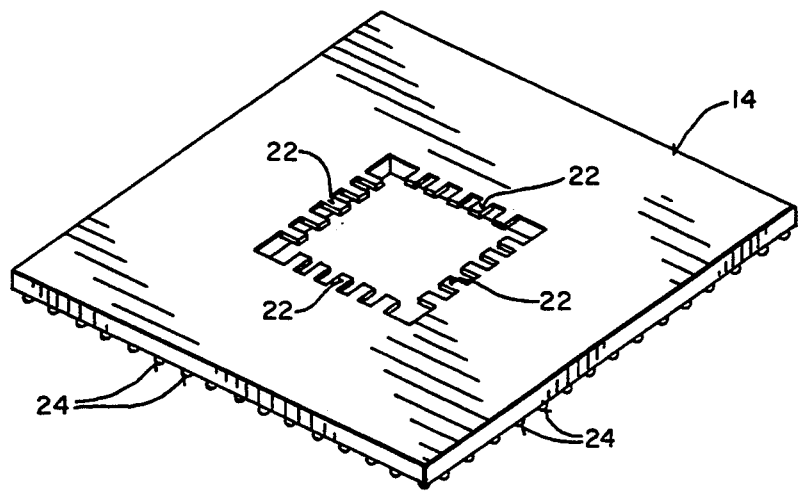

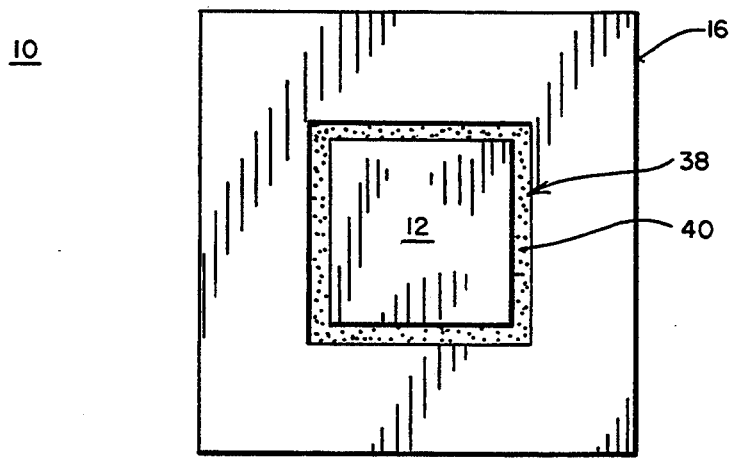
FIG_2
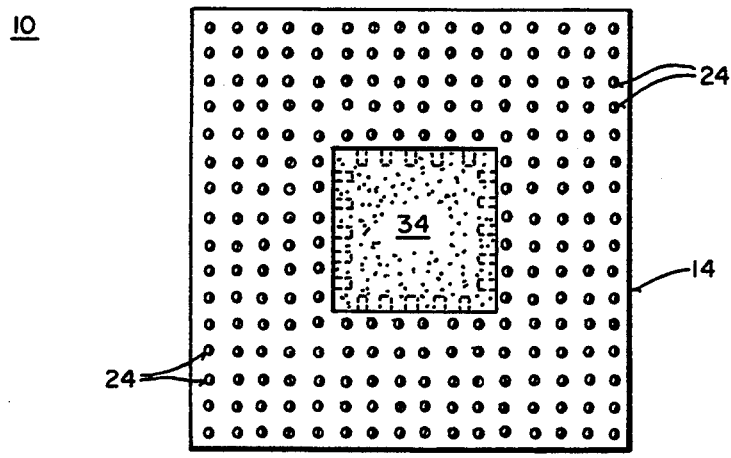
FIG_3
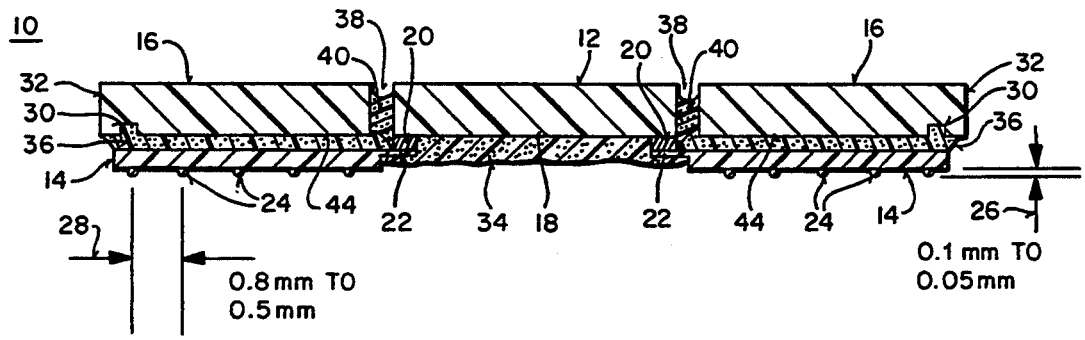
FIG_4

TAB SEMICONDUCTOR PACKAGE WITH CUSHIONED LAND GRID ARRAY OUTER LEAD BUMPS

BACKGROUND OF THE INVENTION

1. Field of the Invention

The present invention relates to the field of semiconductor packaging, in particular, the technique of tape automated bonding (TAB). More specifically, the present invention relates to packaging a very large scale integration (VLSI) semiconductor die using a tape with land grid array (LGA) outer lead bumps having high precision inter-bump pitches.

2. Background

TAB, including the use of tapes with LGA outer lead bumps, is well known in the art of semiconductor packaging. Typically, springs are provided at the land pattern of the socket to which the semiconductor package is to be tested and burned in, to accommodate the differences in the "heights" of the outer lead bumps. Under today's technology, the technique works well as long as the distances between the springs, and therefore the inter-bump pitches, are not less than 1.2 mm. However, as the scale of integration continues to increase, the number of outer lead bumps required also increases. Unless either the size of the tape is increased or the size of the outer lead bumps are decreased, the inter-bump pitches have to be decreased beyond 1.2 mm. If the inter-bump pitches are decreased beyond 1.2 mm, either a new approach for providing the springs at the land pattern of the socket under the tighter requirement has to be provided, or an alternate approach to address the differences in "heights" of the outer lead bumps has to be provided. Thus, it is desirable to be able to package a VLSI semiconductor die using a tape with LGA outer lead bumps having inter-bump pitches smaller than 1.2 mm, without requiring the corresponding land pattern on the socket to address the differences in "heights" of the outer lead bumps. As will be disclosed, the present invention provides for such a TAB semiconductor package which advantageously achieves the desired results. As described in the copending U.S. patent application, Ser. No. 099,740, filed concurrently, and assigned to the assignee of the present invention, the TAB semiconductor package of the present invention has particular application to packaging upgradable multi-chip modules.

SUMMARY OF THE INVENTION

The desired results are advantageously achieved by laminating the tape to the stiffener plate using a film of elastomeric material. The elastomeric material has the necessary physical and electrical characteristics to provide the required firmness to maintain good electrical contact between the outer lead bumps and the corresponding pads on the socket, and at the same time, to provide the required resilience to accommodate the differences in heights between the outer lead bumps. The stiffener plate is fabricated with a cavity at its center for accommodating the VLSI die, and slots along the outer edges of its underside for storing the excess elastomeric material squeezed out when laminating the tape to the stiffener plate. As a result, the excess squeezed out elastomeric material is prevented from building up at the outer edges of the semiconductor package to a height in excess of the outer lead bumps.

The VLSI die is first bonded to the inner leads of the tape. The active side of the VLSI dies is then encapsulated. Next, the elastomeric material is applied to the stiffener plate, for example, using a syringe or screen printing. Then, the tape is laminated to the stiffener plate by applying positive force on the tape with the elastomeric material applied stiffener plate underneath it. After lamination, the elastomeric material undergoes a curing process. Lastly, the gap between VLSI die and the stiffener plate is filled with a soft material.

BRIEF DESCRIPTION OF THE DRAWINGS

The objects, features, and advantages of the present invention will be apparent from the following detailed description of the presently preferred and alternate embodiments of the invention with references to the drawings in which:

FIG. 1 is an exploded front perspective view of the semiconductor package of the present invention.

FIG. 2 is the top view of the semiconductor package of the present invention.

FIG. 3 is the bottom view of the semiconductor package of the present invention.

FIG. 4 is a cross sectional view of the semiconductor package of the present invention.

DETAILED DESCRIPTION PRESENTLY PREFERRED AND ALTERNATE EMBODIMENTS

In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Referring now to FIGS. 1-4, the semiconductor package of the present invention 10 comprises a VLSI die 12, a tape 14, and a stiffener plate 16. In the embodiment illustrated, the VLSI die 12 comprises an active side 18 and a plurality of periphery bumps 20 disposed along the outer edges of the active side 18. The periphery bumps 20 are made of a well known bump material, such as electroplated gold. The tape 14 comprises a plurality of inner leads 22 and a plurality of LGA outer lead bumps 24. The inner leads 22 are made of a well known lead material, such as gold plated copper, and the LGA outer lead bumps 24 are made of a well known bump material, such as electroplated gold, electroplated lead/tin solder or lead/tin solder ball. The LGA outer lead bumps 24 have outside diameters between 0.2 mm to 0.5 mm. Their differences in heights 26 are between 0.1 mm to 0.05 mm. The inter-bump pitches 28 are between 0.8 to 0.5 mm. The stiffener plate 16 is fabricated with a cavity 42 at the center, and slots 30 along the outer edges 32 of its underside 44. The stiffener plate 16 is made of a well known stiffener material, such as aluminum, stainless steel, copper, polyimide, or FR-4. The outside dimensions of the stiffener plate 16 are similar to the tape 14. The size of the cavity 42 is sufficient to accommodate the VLSI die 12, leaving a small gap 38 separating the VLSI die 12 and the stiffener plate 16. The thickness of the stiffener plate 16 is slightly thicker than that of the VLSI die 12.

The periphery bumps 20 of the VLSI die 12 are bonded to the inner leads 22 of the tape 14 in a manner well known in the art, and the active side 18 of the VLSI die 12 is encapsulated with a well known encapsulation material 34, such as epoxy or silicone encapsulant. The encapsulation material 34 is cured in a well known manner.

The tape 14 is laminated to the stiffener plate 16 using a film of elastomeric material 36. The elastomeric material 36 has the necessary physical and electrical characteristics to provide the required firmness to maintain good electrical contact between the outer lead bumps 24 and their contacting pads and at the same time, to provide the required resilience to accommodate the differences in heights between the outer lead bumps 24. The contacting pads may be contacting pads of a socket, a ceramic substrate, or a printed wiring board (PWB). Preferably, the physical and electric properties are as follows:

| | |
|---|---|
| Viscosity @ 25 C, centipoise, before curing | 7K to 1,500K |
| Durometer hardness @ 25 C, Shore A, after curing | 20 to 65 |
| Elongation @ 25 C, percent, after curing | 120 to 250 |
| Glass transition temperature, C., after curing | −150 to −100 |
| Dielectric strength, KV per mm, after curing | 22 to 16 |
| Volume resistivity, ohm-cm, after curing | 3.5 to 12 10E15 |
| Dielectric constant, 1 MHZ, after curing | 2.0 to 3.0 |
| Dissipation factor, 1 MHZ, after curing | 0.5 to 1.0 10E-3 |

The elastomeric material 36 is first applied to the stiffener plate 16, for example, using a syringe or screen printing. Preferably, the thickness is between 0.25 mm to 0.13 mm. If it is applied using a syringe, the elastomeric material 36 with the above described physical characteristics will spread out by its gravity. Preferably, different application patterns are used to improve the flowing of the elastomeric material 36.

The tape 14 is then laminated to the stiffener plate 16 by applying positive force on the tape 14 (with the stiffener plate 16 underneath the tape 14, as opposed to their relative positions illustrated in FIGS. 1-4). As force is applied to the tape 14, the excess elastomeric material 36 is squeezed out and partially filling the gap 38 at the inner edges of the stiffener plate 16 and into the pre-fabricated slots 30 along the outer edges 32 of the stiffener plate 16. As a result, the excess squeezed out elastomeric material 36 is prevented from building up at the outer edges of the semiconductor package 10 to a height in excess of the outer lead bumps 24.

The elastomeric material 36 then undergoes a curing process. Preferably, it is first precured at 50 to 80 C. for 15 to 30 minutes, and then final curing is performed at 120 to 170 C. for 30 to 60 minutes. After curing, the elastomeric material 36 with the above described physical characteristics will provide the desired firmness and resilience to simultaneously maintain good electric contact between the outer lead bumps 24 and the corresponding contacting pads on the socket, ceramic substrate, or PWB, and accommodate the differences in heights between the outer lead bumps 24. Lastly, the gap 38 between the VLSI die 12 and the stiffener plate 16 is filled with a well known soft material, such as silicone gel.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claim is:

1. A semiconductor package comprising:
    a) a VLSI die having a first thickness, a first set of outer dimensions, a first plurality of outer edges, an active side and a plurality of periphery bumps disposed along said first plurality of outer edges on said active side;
    b) a tape having a second set of outer dimensions, a plurality of inner leads and a plurality of LGA outer lead bumps, said LGA outer lead bumps having inter-bump pitches less than 1.2 mm and differences in bump heights within a predetermined range, said periphery bumps of said VLSI die being bonded to said inner leads of said tape;
    c) a layer of encapsulant encapsulating said active side of said VLSI die;
    d) a stiffener plate having a third set of outer dimensions, a second thickness, a second plurality of outer edges, an underside, a center, a cavity disposed at said center having a fourth set of outer dimensions, and a plurality of slots disposed along said second plurality of outer edges on said underside, said fourth set of outer dimensions being larger than said first set of outer dimensions, said second and third set of outer dimensions being substantially the same, said second thickness being slightly thinner than said first thickness;
    e) a film of elastomeric material for laminating said tape to said stiffener plate, said VLSI die being accommodated by said cavity of said stiffener plate forming a gap between said VLSI die and said stiffener plate, excess of said elastomeric material being stored in said slots and said gap, said elastomeric material for simultaneously maintaining good electrical contact between said outer lead bumps and a plurality of contacting LGA pads and for accommodating said predetermined range of differences in heights of said LGA outer lead bumps, said elastomeric material being coupled to said VLSI die, tape and stiffener plate; and
    f) a ring of soft material filling said gap between said VLSI die and said stiffener plate.

2. The semiconductor package as set forth in claim 1, wherein,
    said periphery bumps of said VLSI die is first bonded to said inner leads of said tape;
    said encapsulant is then applied;
    said film of elastomeric material is then applied to said underside of said stiffener plate;
    said tape is then laminated to said stiffener plate by applying positive force on said tape with said elastomeric material applied stiffener plate underneath said tape, said excess of elastomeric material being squeezed out into said slots and gap as said positive force is applied;
    said film of elastomeric material is then underwent a curing process; and
    said soft filling material is then applied.

3. The semiconductor package as set forth in said claim 1, wherein,
    each of said LGA outer lead bumps has an outside diameter between 0.20 and 0.50 mm;
    said inter-bump pitches are between 0.8 to 0.5 mm; and said predetermined range of heights between said LGA outer lead bumps is between 0.1 and 0.05 mm.

4. The semiconductor package as set forth in claim 1, wherein, said film of elastomeric material applied to said stiffener plate has a thickness between 0.25 and 0.13 mm.

5. The semiconductor package as set forth in claim 1, wherein said elastomeric material has physical characteristics including:
   a viscosity characteristic being 7K to 1,500K centipoise, at 25° C., before curing;
   a durometer hardness characteristic being 20 to 65 Shore A, at 25° C., after curing;
   an elongation characteristic being 120 to 250 percent, at 25° C., after curing; and
   a glass transition temperature being $-150°$ to $-100°$ C., after curing.

6. The semiconductor package as set forth in claim 1, wherein said elastomeric material has electrical characteristics including:
   a dielectric strength characteristic being 22 to 16 KV per mm, after curing;
   a volume resistivity characteristic being $3.5 \times 10E15$ to $12 \times 10E15$ ohm-cm, after curing;
   a dielectric constant characteristic being 2.0 at 3.0 at 1 MHZ, after curing; and
   a dissipation factor characteristic being $0.5 \times 10E-3$ to $1.0 \times 10E-3$ at 1 MHZ, after curing.

7. The semiconductor package as set forth in claim 1, wherein, said film of elastomeric material applied to said stiffener plate is precured first at 50 to 80 C. for 15 to 30 minutes, and then final cured at 120 to 170 C. for 30 to 60 minutes.

8. A semiconductor package comprising:
   a) a VLSI die having a first thickness, a first set of outer dimensions, a first plurality of outer edges, an active side and a plurality of periphery bumps disposed along said first plurality of outer edges on said active side;
   b) a tape having a second set of outer dimensions, a plurality of inner leads and a plurality of LGA outer lead bumps, said LGA outer lead bumps having inter-bump pitches less than 1.2 mm and differences in bump heights within a predetermined range, said periphery bumps of said VLSI die being bonded to said inner leads of said tape;
   each of said LGA outer lead bumps having an outside diameter between 0.25 and 0.35 mm, said inter-bump pitches being between 0.8 to 0.5 mm, said predetermined range of heights between said LGA outer lead bumps being between 0.1 and 0.05 mm;
   c) a layer of encapsulant encapsulating said active side of said VLSI die;
   d) a stiffener plate having a third set of outer dimensions, a second thickness, a second plurality of outer edges, an underside, a center, a cavity disposed at said center having a fourth set of outer dimensions, and a plurality of slots disposed along said second plurality of outer edges on said underside, said fourth set of outer dimensions being larger than said first set of outer dimensions, said second and third set of outer dimensions being substantially the same, said second thickness being slightly thicker than said first thickness;
   e) a film of elastomeric material for laminating said tape to said stiffener plate, said VLSI die being accommodated by said cavity of said stiffener plate forming a gap between said VLSI die and said stiffener plate, excess of said elastomeric material being stored in said slots and said gap, said elastomeric material for simultaneously maintaining good electrical contact between said outer lead bumps and a plurality of contacting LGA pads and for accommodating said predetermined range of differences in heights of said LGA outer lead bumps, said elastomeric material being coupled to said VLSI die, tape and stiffener plate;
   said film of elastomeric material applied to said stiffener plate being 0.25 and 0.13 mm thick, and said film of elastomeric material being precured first at 50 to 80 C. for 15 to 30 minutes, and then final cured at 120 to 170 C. for 30 to 60 minutes; and
   f) a ring of soft material filling said gap between said VLSI die and said stiffener plate.

9. The semiconductor package as set forth in claim 8, wherein,
   said periphery bumps of said VLSI die is first bonded to said inner leads of said tape;
   said encapsulant is then applied;
   said film of elastomeric material is then applied to said underside of said stiffener plate;
   said tape is then laminated to said stiffener plate by applying positive force on said tape with said elastomeric material applied stiffener plate underneath said tape, said excess of elastomeric material being squeezed out into said slots and gap as said positive force is applied;
   said film of elastomeric material is then underwent a curing process; and said soft filling material is then applied.

10. The semiconductor package as set forth in claim 8, wherein said elastomeric material has physical characteristics including:
   a viscosity characteristic being 7K to 1,500K centipoise, at 25° C., before curing;
   a durometer hardness characteristic being 20 to 65 Shore A, at 25° C., after curing;
   an elongation characteristic being 120 to 250 percent, at 25° C., after curing; and
   a glass transition temperature being $-150°$ to $-100°$ C., after curing.

11. The semiconductor package as set forth in claim 8, wherein said elastomeric material has electrical characteristics including:
   a dielectric strength characteristic being 22 to 16 KV per mm, after curing;
   a volume resistivity characteristic being $3.5 \times 10E15$ to $12 \times 10E15$ ohm-cm, after curing;
   a dielectric constant characteristic being 2.0 to 3.0 at 1 MHZ, after curing; and
   a dissipation factor characteristic being $0.5 \times 10E-3$ to $1.0 \times 10E-3$ at 1 MHZ, after curing.

* * * * *